United States Patent
Xu et al.

(10) Patent No.: US 8,850,276 B2
(45) Date of Patent: Sep. 30, 2014

(54) SYSTEMS AND METHODS FOR EFFICIENT DATA SHUFFLING IN A DATA PROCESSING SYSTEM

(75) Inventors: Changyou Xu, Fremont, CA (US); Zongwang Li, San Jose, CA (US); Sancar K. Olcay, Sunnyvale, CA (US); Yang Han, Sunnyvale, CA (US); Kaichi Zhang, Fremont, CA (US)

(73) Assignee: LSI Corporation, San Jose, CA (US)

( * ) Notice: Subject to any disclaimer, the term of this patent is extended or adjusted under 35 U.S.C. 154(b) by 474 days.

(21) Appl. No.: 13/239,683

(22) Filed: Sep. 22, 2011

(65) Prior Publication Data
US 2013/0080844 A1   Mar. 28, 2013

(51) Int. Cl.
| | | |
|---|---|---|
| G06F 11/00 | (2006.01) | |
| G11C 29/00 | (2006.01) | |
| H03M 13/27 | (2006.01) | |
| H03M 13/00 | (2006.01) | |
| H04L 1/00 | (2006.01) | |
| H03M 13/41 | (2006.01) | |
| H03M 13/11 | (2006.01) | |
| H03M 13/39 | (2006.01) | |

(52) U.S. Cl.
CPC ............. *H04L 1/0052* (2013.01); *H03M 13/41* (2013.01); *H03M 13/271* (2013.01); *H03M 13/1102* (2013.01); *H03M 13/6561* (2013.01); *H04L 1/0071* (2013.01); *H03M 13/3905* (2013.01)
USPC .......................................... 714/701; 714/702

(58) Field of Classification Search
USPC .................................................. 714/701, 702
See application file for complete search history.

(56) References Cited

U.S. PATENT DOCUMENTS

| | | | |
|---|---|---|---|
| 4,394,642 A | * | 7/1983 | Currie et al. ..................... 341/81 |
| 5,056,112 A | * | 10/1991 | Wei ............................... 375/280 |
| 5,278,703 A | | 1/1994 | Rub |
| 5,278,846 A | | 1/1994 | Okayama et al. |
| 5,325,402 A | | 6/1994 | Ushirokawa |
| 5,392,299 A | | 2/1995 | Rhines et al. |
| 5,471,500 A | | 11/1995 | Blaker et al. |
| 5,513,192 A | | 4/1996 | Janku et al. |
| 5,523,903 A | | 6/1996 | Hetzler |
| 5,550,870 A | | 8/1996 | Blaker et al. |
| 5,612,964 A | | 3/1997 | Haraszti |
| 5,701,314 A | | 12/1997 | Armstrong et al. |
| 5,710,784 A | | 1/1998 | Kindred et al. |
| 5,712,861 A | | 1/1998 | Inoue et al. |
| 5,717,706 A | | 2/1998 | Ikeda |
| 5,768,044 A | | 6/1998 | Hetzler |
| 5,802,118 A | | 9/1998 | Bliss et al. |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Joseph D Torres
(74) *Attorney, Agent, or Firm* — Hamilton DeSanctis & Cha (57) ABSTRACT

Various embodiments of the present invention provide systems and methods for data processing. Such data processing includes data shuffling.

10 Claims, 5 Drawing Sheets

(56) References Cited

U.S. PATENT DOCUMENTS

| | | | |
|---|---|---|---|
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,553,516 B1 * | 4/2003 | Suda et al. ............... 714/702 |
| 6,625,763 B1 * | 9/2003 | Boner .................... 714/701 |
| 6,625,775 B1 | 9/2003 | Kim |
| 6,631,491 B1 * | 10/2003 | Shibutani et al. ........ 714/762 |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,904,077 B2 * | 6/2005 | Toskala et al. ............ 375/130 |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greeberg et al. |
| 7,093,179 B2 | 8/2006 | Shea |
| 7,113,356 B1 | 9/2006 | Wu |
| 7,136,244 B1 | 11/2006 | Rothberg |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,523,375 B2 | 4/2009 | Spencer |
| 7,583,584 B2 * | 9/2009 | Wang et al. ................. 370/206 |
| 7,587,657 B2 | 9/2009 | Haratsch |
| 7,590,168 B2 | 9/2009 | Raghaven et al. |
| 7,590,927 B1 | 9/2009 | Shih et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong et al. |
| 7,801,200 B2 | 9/2010 | Tan |
| 7,802,163 B2 | 9/2010 | Tan |
| 8,381,071 B1 * | 2/2013 | Gunnam ................. 714/763 |
| 8,381,074 B1 * | 2/2013 | Gunnam et al. ......... 714/764 |
| 8,402,348 B1 * | 3/2013 | Gunnam et al. ......... 714/773 |
| 8,522,110 B2 * | 8/2013 | Kwon et al. ............. 714/755 |
| 2003/0023909 A1 * | 1/2003 | Ikeda et al. ............. 714/702 |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0078399 A1 | 4/2005 | Fung |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047121 A1 | 3/2007 | Elefeheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0185643 A1 | 7/2009 | Fitzpatrick |
| 2009/0199071 A1 | 8/2009 | Graef |
| 2009/0235116 A1 | 9/2009 | Tan et al. |
| 2009/0235146 A1 | 9/2009 | Tan |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunam |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0167246 A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.

(56) References Cited

OTHER PUBLICATIONS

U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, filed Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 03, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low- denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)" (dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.

(56) References Cited

OTHER PUBLICATIONS

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-23, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

| | | | | | | | |
|---|---|---|---|---|---|---|---|
| 146b Codeword 0 Chunk A | Codeword 0 Chunk G | Codeword 0 Chunk E | Codeword 0 Chunk C | Codeword 0 Chunk D | Codeword 0 Chunk F | Codeword 0 Chunk B | Codeword 0 Chunk H |
| 146e Codeword 1 Chunk F | Codeword 1 Chunk G | Codeword 1 Chunk D | Codeword 1 Chunk C | Codeword 1 Chunk B | Codeword 1 Chunk E | Codeword 1 Chunk A | Codeword 1 Chunk H |
| 146g Codeword 2 Chunk B | Codeword 2 Chunk E | Codeword 2 Chunk F | Codeword 2 Chunk D | Codeword 2 Chunk C | Codeword 2 Chunk A | Codeword 2 Chunk H | Codeword 2 Chunk G |
| 146d Codeword 3 Chunk E | Codeword 3 Chunk H | Codeword 3 Chunk A | Codeword 3 Chunk B | Codeword 3 Chunk D | Codeword 3 Chunk G | Codeword 3 Chunk C | Codeword 3 Chunk F |
| 146h Codeword 4 Chunk F | Codeword 4 Chunk H | Codeword 4 Chunk E | Codeword 4 Chunk A | Codeword 4 Chunk D | Codeword 4 Chunk B | Codeword 4 Chunk G | Codeword 4 Chunk C |
| 146a Codeword 5 Chunk C | Codeword 5 Chunk D | Codeword 5 Chunk E | Codeword 5 Chunk G | Codeword 5 Chunk H | Codeword 5 Chunk B | Codeword 5 Chunk F | Codeword 5 Chunk A |
| 146f Codeword 6 Chunk B | Codeword 6 Chunk F | Codeword 6 Chunk A | Codeword 6 Chunk H | Codeword 6 Chunk G | Codeword 6 Chunk C | Codeword 6 Chunk D | Codeword 6 Chunk E |
| 146c Codeword 7 Chunk D | Codeword 7 Chunk H | Codeword 7 Chunk G | Codeword 7 Chunk C | Codeword 7 Chunk A | Codeword 7 Chunk F | Codeword 7 Chunk E | Codeword 7 Chunk B |

| | | | |
|---|---|---|---|
| 321 Codeword 1 Chunk F and Chunk G | Codeword 3 Chunk A and Chunk B | Codeword 0 Chunk D and Chunk F | Codeword 7 Chunk E and Chunk B |
| 322 Codeword 6 Chunk B and Chunk F | Codeword 6 Chunk A and Chunk H | Codeword 2 Chunk C and Chunk A | Codeword 3 Chunk C and Chunk F |
| 323 Codeword 5 Chunk C and Chunk D | Codeword 7 Chunk G and Chunk C | Codeword 4 Chunk A and Chunk B | Codeword 1 Chunk A and Chunk H |
| 324 Codeword 0 Chunk A and Chunk G | Codeword 2 Chunk F and Chunk D | Codeword 5 Chunk H and Chunk B | Codeword 0 Chunk B and Chunk H |
| 325 Codeword 7 Chunk D and Chunk H | Codeword 1 Chunk D and Chunk C | Codeword 6 Chunk G and Chunk C | Codeword 4 Chunk G and Chunk C |
| 326 Codeword 3 Chunk E and Chunk H | Codeword 5 Chunk E and Chunk G | Codeword 2 Chunk C and Chunk A | Codeword 2 Chunk H and Chunk G |
| 327 Codeword 2 Chunk B and Chunk E | Codeword 0 Chunk E and Chunk C | Codeword 3 Chunk D and Chunk G | Codeword 2 Chunk F and Chunk A |
| 328 Codeword 4 Chunk F and Chunk H | Codeword 4 Chunk E and Chunk A | Codeword 1 Chunk B and Chunk E | Codeword 6 Chunk D and Chunk E |

SYSTEMS AND METHODS FOR EFFICIENT DATA SHUFFLING IN A DATA PROCESSING SYSTEM

BACKGROUND OF THE INVENTION

The present inventions are related to systems and methods for decoding information, and more particularly to systems and methods for data processing that includes data shuffling.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any losses in data caused by various factors. In some cases, an encoding/decoding process is used to enhance the ability to detect a data error and to correct such data errors. As an example, a simple data detection and decode may be performed, however, such a simple process often lacks the capability to converge on a corrected data stream. To increase the possibility of convergence, various existing processes utilize two or more detection and decode iterations. Further data may be shuffled to limit the impact of burst errors on an ability to converge on the proper data set. In many cases, the aforementioned systems are inefficient.

Hence, for at least the aforementioned reasons, there exists a need in the art for advanced systems and methods for data processing.

BRIEF SUMMARY OF THE INVENTION

The present inventions are related to systems and methods for decoding information, and more particularly to systems and methods for data processing that includes data shuffling.

Various embodiments of the present invention provide methods for data processing that include: receiving a data input having at least a first local chunk and a second local chunk, the data input also being defined as having at least a first global chunk and a second global chunk; rearranging an order of the first local chunk and the second local chunk to yield a locally interleaved data set; storing the locally interleaved data set to a first memory, such that the first global chunk is stored to a first memory space, and the second global chunk is stored to a second memory space; accessing the locally interleaved data set from the first memory; and storing the locally interleaved data set to a second memory. The first global chunk is stored to a third memory space defined at least in part based on the first memory space, and the second global chunk is stored to a fourth memory space defined at least in part based on the second memory space.

In some instances of the aforementioned embodiments, the first memory space is a first column and a first row, and the second memory space is a second column and the first row. In some such instances, the first row is a randomly selected row. In various of such instances, the third memory space is a third column and a second row, and the fourth memory space is a fourth column and a third row. In some such instances, the second row is randomly selected, and the third row is randomly selected. In other such instances, the third column is selected based at least in part on the first column, and the fourth column is selected based at least in part on the second column. In yet other such instances, the third column is the same as the first column, and the fourth column is the same as the second column.

In one or more instances of the aforementioned embodiments, the methods further include: applying a data detection algorithm to a data set to yield the data input; accessing a globally interleaved data set from a fifth memory space in the second memory; and applying a data decode algorithm to the globally interleaved data set. In some such instances, the third memory space is a third column and a second row, the fourth memory space is a fourth column and a third row, and the first memory space is the second row including at least the first global chunk. In various such instances, the data detection algorithm may be, but is not limited to, a maximum a posteriori data detection algorithm, or a Viterbi algorithm data detection algorithm. In some cases, the data decode algorithm is a low density parity check algorithm.

Other embodiments of the present invention provide data processing systems that include: a local interleaver circuit and a column controlled interleaver circuit. The local interleaver circuit is operable to: receive a data input that includes at least a first local chunk and a second local chunk, rearrange an order of the first local chunk and the second local chunk to yield a locally interleaved data set, and write the locally interleaved data set to a first row of a first memory. The locally interleaved data set includes at least a first global chunk stored to a first column of the first memory, and a second global chunk stored to a second column of the first memory. The column controlled interleaver circuit is operable to: access the locally interleaved data set from the first row of the first memory, store the first global chunk to the first column and a second row of a second memory, store the second global chunk to the second column and a third row of the second memory.

In some instances of the aforementioned embodiments, the data processing system is implemented as, but is not limited to, a storage device or a receiving device. In various instances of the aforementioned embodiments, the data processing system is implemented as part of an integrated circuit. In one or more instances of the aforementioned embodiments, the first row of the first memory is randomly selected, the second row of the second memory is randomly selected, and the third row of the second memory is randomly selected. In various instances of the aforementioned embodiments, the first column of the second memory is selected to correspond to the first column of the first memory, and the second column of the second memory is selected to correspond to the second column of the first memory. In some instances of the aforementioned embodiments, the system further includes: a data detector circuit and a data decoder circuit. The data detector circuit is operable to apply a data detection algorithm to a data set to yield the data input. The data decoder circuit is operable to apply a data decode algorithm to a globally interleaved data set generated by accessing the second row of the second memory including the first global chunk.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is

DETAILED DESCRIPTION OF THE INVENTION

The present inventions are related to systems and methods for decoding information, and more particularly to systems and methods for data processing that includes data shuffling.

Various embodiments of the present invention provide for shuffling data between operations of a data detector circuit and a data decoder circuit. The shuffling process, also referred to herein as "interleaving", includes both a local interleaving and a global interleaving. As used herein, the phrase "local interleaving" or "local shuffling" is used in its broadest sense to mean rearranging data within a defined codeword. Also, as used herein, the phrase "global interleaving" or "global shuffling" is used in its broadest sense to mean rearranging data across multiple codewords. As used herein, the terms "de-interleaving" and "de-shuffling" are used in their broadest sense to mean reversing the process of interleaving and shuffling. In some of the embodiments discussed herein, a combination of local interleaving and global interleaving are to minimize the effects of burst errors in a given codeword upon the data decoding process. A two step global interleaving and corresponding de-interleaving are used that reduce the amount of circuitry needed when compared with a single step global interleaving.

Figure 1:
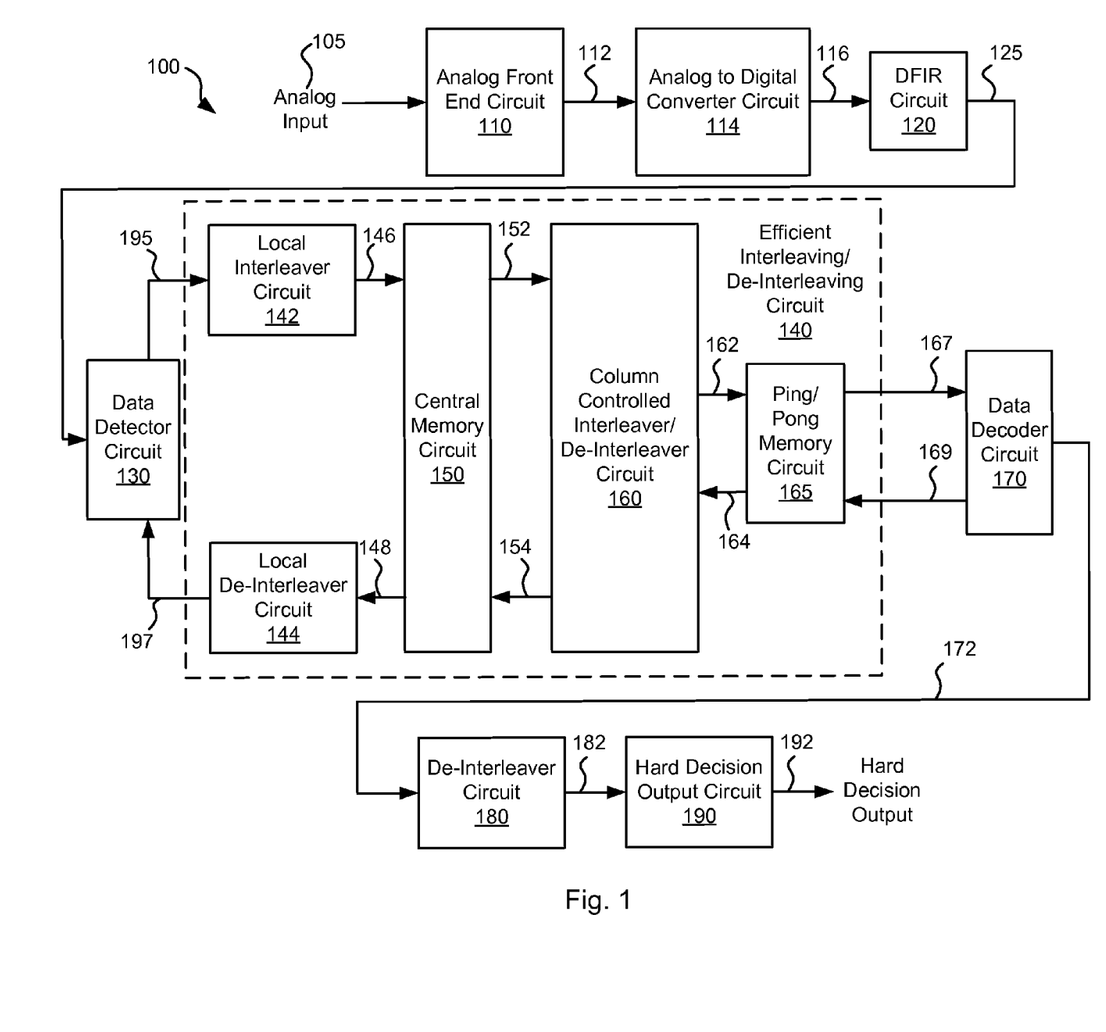
FIG. 1 shows a data processing circuit including an efficient interleaving/de-interleaving circuit in accordance with one or more embodiments of the present invention.

Turning to FIG. 1, a data processing circuit 100 including an efficient interleaving/de-interleaving circuit 140 is shown in accordance with one or more embodiments of the present invention. Efficient interleaving/de-interleaving circuit 140 implements both local interleaving and global interleaving with the global interleaving being performed as a two step process implemented by a local interleaver circuit 142 and a column controlled interleaver/de-interleaver circuit 160. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer 120 includes sufficient memory to maintain one or more codewords until a data detector circuit 130 is available for processing.

Equalized output 125 is provided to detector circuit 130 that is operable to apply a data detection algorithm to a received codeword, and in some cases can process two or more codewords in parallel. In some embodiments of the present invention, data detector circuit is a Viterbi algorithm data detector circuit as are known in the art. In other embodiments of the present invention, data detector circuit 130 is a maximum a posteriori data detector circuit as are known in the art. Based upon the disclosure provided herein, one of ordinary skill in the art will recognize a variety of data detector circuits that may be used in relation to different embodiments of the present invention. Data detector circuit 130 is started based upon availability of a codeword from either equalizer 120 or efficient interleaving/de-interleaving circuit 140.

Figure 2:
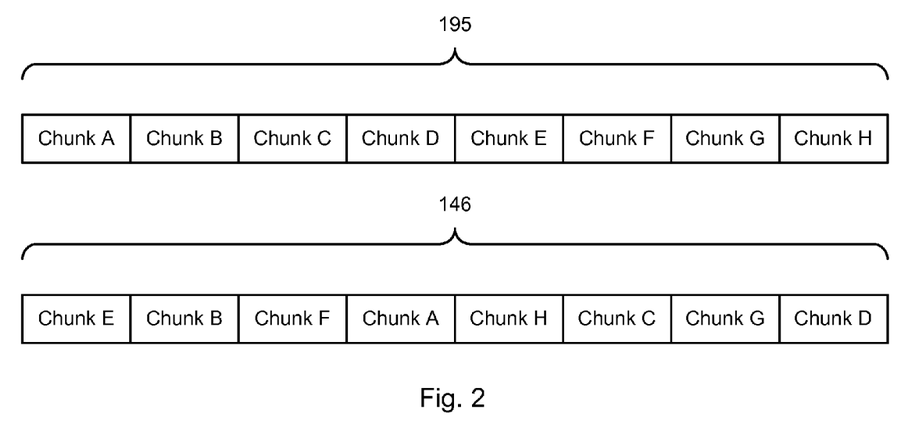
FIG. 2 shows an example of a detected output that is locally interleaved (i.e., shuffled) to yield an locally interleaved codeword.

Data detector circuit 130 applies the data detection algorithm to either a codeword received as equalized output 125 or to a codeword received as de-interleaved output 197 from efficient interleaving/de-interleaving circuit 140. The result of applying the data detection algorithm is a detected output 195 that is provided to efficient interleaving/de-interleaving circuit 140. When a detected output 195 is ready, it is stored to a central memory circuit 150 where it awaits processing by a data decoder circuit 170. In some cases, detected output 195 is log likelihood ratio data. Before being stored to central memory circuit 150, detected output 195 is processed through local interleaver circuit 142 that shuffles sub-portions (i.e., local chunks) of the codeword included as detected output 195 and provides an interleaved codeword 146 that is stored to central memory circuit 150. FIG. 2 shows an example of a detected output 195 and a corresponding interleaved codeword 146. As shown, the chunks (referred to herein more specifically as local chunks) in detected output 195 are in a first order. It should be noted that a given codeword represented by detected output 195 may be broken into smaller or larger local chunks.

Figure 3A:
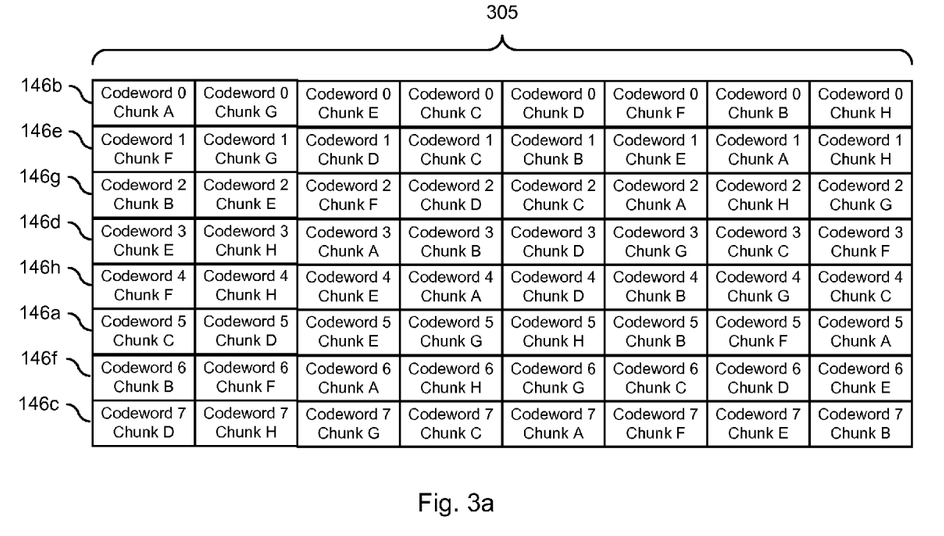
FIGS. 3a and 3b show an example of a two step global interleaving process in accordance with some embodiments of the present invention.

Subsequent to processing by local interleaver circuit 142, the local chunks are placed in a different order. This rearranging increases the randomness and thereby mitigates the effect of any burst errors. In prior art systems, the write operation of interleaved codeword 146 to central memory circuit 150 involved writing one interleaved codeword 146 after another is done on a row by row basis into central memory circuit 150, and the global interleaving is done when the data is transferred out of central memory circuit 150. In contrast, in efficient interleaving/de-interleaving circuit 140, when writing interleaved codeword 146 to central memory circuit 150, each instance of interleaved codeword 146 is written to a random row location in central memory circuit 150. The random row mapping may be done based upon a random number generator limited to row numbers in central memory circuit 150 that are known to be available. In this way, a random row write does not overwrite needed data, but is rather limited to vacated row locations. In some cases, the row mapping function is programmed to a look up table (not shown). This is the first of a two step global interleaving process. FIG. 3a depicts an example of writing a number of instances of interleaved codeword 146 to a portion 305 of central memory circuit 150. As shown, the row into which a given interleaved codeword is written is random.

A ping/pong memory circuit 165 is used to pull a global interleaved data set 162 from central memory circuit 150 for data decoder circuit 170 by way of column controlled interleaver/de-interleaver circuit 160. Once data decoder circuit 170 is available, a global interleaved codeword 167 is pulled form ping/pong memory circuit 165 and data decoder circuit 170 applies a data decode algorithm to the received codeword. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. As the data decode algorithm completes on a given codeword, the completed codeword is written back as a decoded output 169 to ping/pong memory circuit 165. Once the write back is complete to ping/pong memory circuit 165, a corresponding codeword 164 is transferred to central memory circuit 150 by way of column controlled interleaver/de-interleaver circuit 160.

Figure 3B:
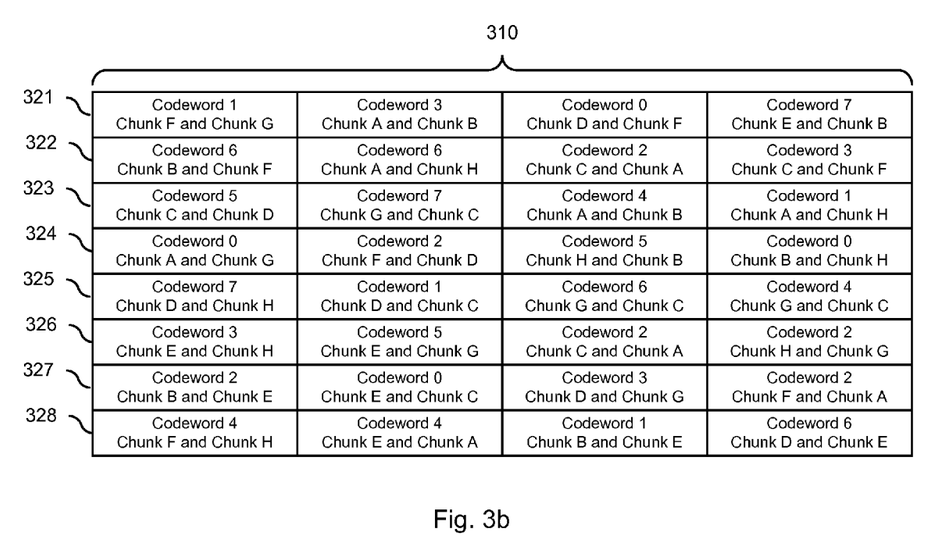

When a codeword is transferred from central memory circuit 150 as a partially globally interleaved codeword 152, column controlled interleaver/de-interleaver circuit 160 again modifies the row into which a given global chunk is placed. A global chunk may be the same size as the local chunks, while in other cases the global chunks may be different in size from the local chunks. Of note, when transferring data from central memory circuit 150 to ping/pong memory circuit 165, column controlled interleaver/de-interleaver circuit 160 changes the row into which a given global chunk is written, but maintains the column. The row into which a global chunk is placed may be randomly selected or selected based upon a mapping scheme. Thus, a global chunk is written to the same column in ping/pong memory circuit 165 that it was pulled from in central memory circuit 150. By maintaining the columns consistent between a location in ping/pong memory circuit 165, a layer of multiplexers may be eliminated yielding a more efficient global interleaving/de-interleaving with a corresponding reduction in power consumption compared with allowing a global interleaving/de-interleaving with randomly assigned columns. This process of modifying the rows while maintaining consistent column location is shown in FIG. 3b. In particular, FIG. 3b shows the distribution of global chunks across a portion 310 of ping/pong memory circuit 165. In this case, the global chunks are twice as large as two of the local chunks. Each row 321, 322, 323, 324, 325, 326, 327, 328 of portion 310 includes a number of global chunks (e.g., a combination of codeword 1, chunk f and chunk G) distributed across random rows, but maintaining the same column location as in portion 305 discussed above. This process of modifying the row location of global chunks from central memory circuit 150 while maintaining a consistent column location is the second step of the global interleaving process.

When codeword 164 is written from ping/pong memory circuit 165 to central memory circuit 150, column controlled interleaver/de-interleaver circuit 160 reverses the row modification originally applied when the data was originally written from central memory circuit 150 to ping/pong memory circuit 165. This reversal yields a partially globally interleaved codeword 154 that is written to central memory circuit 150. When data detector circuit 130 becomes free, a corresponding partially globally interleaved codeword 148 is provided to data detector circuit 130 as a de-interleaved codeword 197 by a local de-interleaver circuit 144. Local de-interleaver circuit 144 reverses the processes originally applied by local interleaver circuit 142. Once data detector circuit 130 completes application of the detection algorithm to de-interleaved codeword 197, the result is provided as detected output 195.

Where data decoder circuit 170 converges (i.e., results in the originally written data), the resulting decoded data is provided as a hard decision output 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order codewords that may complete out of order back into their original order. The originally ordered codewords are then provided as a hard decision output 192.

Figure 4:
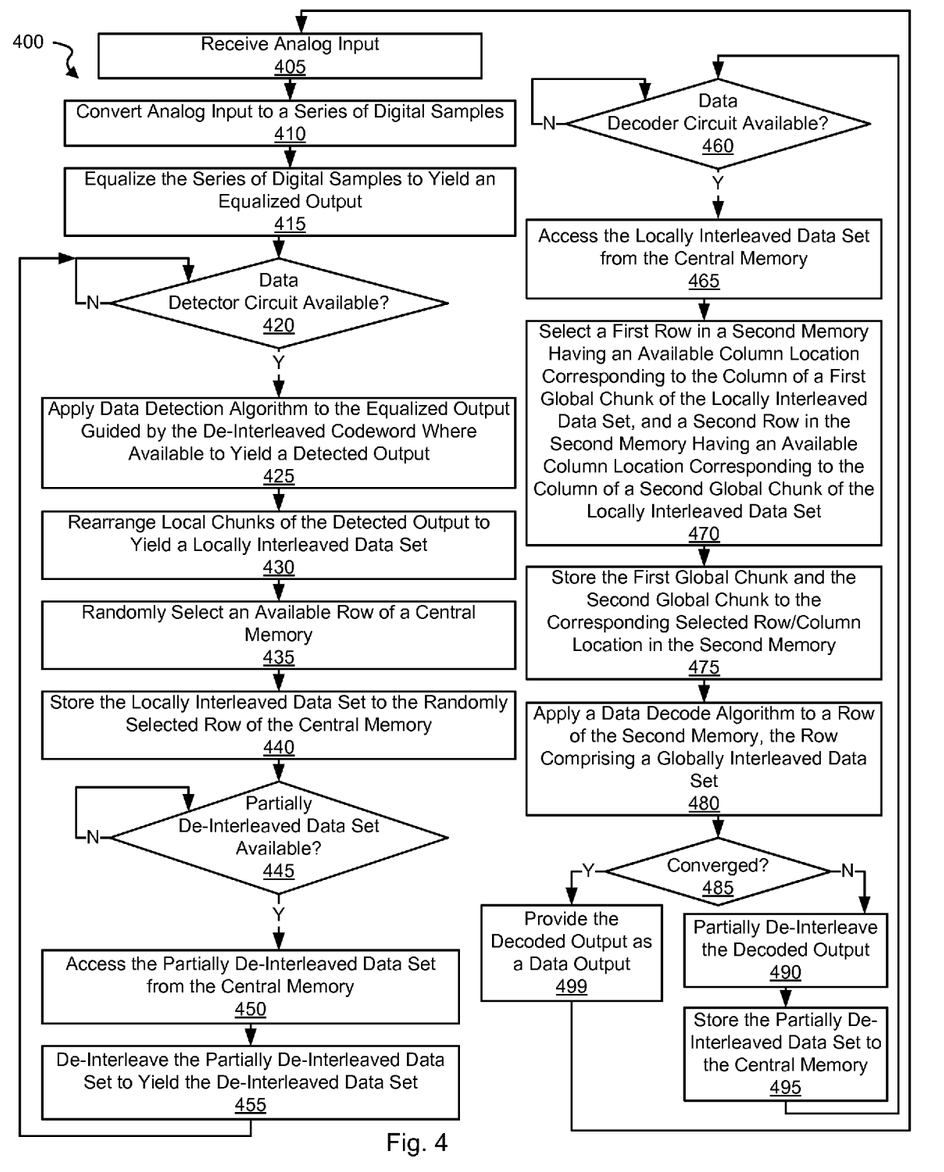
FIG. 4 is a flow diagram showing a method for efficient global interleaving in a data processing circuit in accordance with various embodiments of the present invention.

Turning to FIG. 4, a flow diagram 400 shows a method for efficient global interleaving in a data processing circuit in accordance with various embodiments of the present invention. Following flow diagram 400, an analog input signal is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 420). Where a data detector circuit is available (block 420), a data detection algorithm is applied to the equalized output guided by a de-interleaved codeword where a such a de-interleaved codeword corresponding to the equalized output is available (i.e., the second and later iterations through the data detector circuit and the data decoder circuit). This process yields a detected output (block 425). In some embodiments of the present invention, data detection algorithm is a Viterbi algorithm as are known in the art. In other embodiments of the present invention, the data detection algorithm is a maximum a posteriori data detector circuit as are known in the art. Local chunks in the detected output are re-arranged or shuffled to yield a locally interleaved data set (block 430).

FIG. 2 above shows an example of a detected output 195 and a corresponding locally interleaved codeword 146. As shown, the chunks (referred to herein more specifically as local chunks) in detected output 195 are in a first order, and the same chunks in the locally interleaved codeword are in a second order. It should be noted that a given codeword represented by detected output 195 may be broken into smaller or larger local chunks.

A row of a central memory is randomly selected (block 435), and the locally interleaved data set is stored to the selected row (block 440). The process of writing the locally interleaved data set to a randomly selected row of the central memory completes the first step of a two step global interleaving process. It is then determined whether a partially de-interleaved data set is available for use in the data detection process (block 445). Where a partially de-interleaved data set is available, block 445), the partially de-interleaved data set is accessed from the central memory (block 450) and the partially de-interleaved data set is de-interleaved to yield the de-interleaved data set for use in guiding the detection process (block 455). De-interleaving the partially de-interleaved data set is the reverse of the process described above in relation to FIG. 2.

In parallel to the previously discussed processing, it is determined whether a data decoder circuit is available (block 460). Where the data decoder circuit is available (block 460) a previously stored locally interleaved data set is accessed from the central memory (block 465). A first row in a second memory having an available column location corresponding to the column of a first global chunk of the locally interleaved codeword is selected, and a second row in the second memory having an available column location corresponding to the column of a second global chunk of the locally interleaved codeword is selected (block 470). The first chunk of the locally interleaved data set is written to the previously selected row and column in the second memory, and the second chunk of the locally interleaved data set is written to the previously selected row and column in the second memory (block 475). The process of writing the global chunks to the selected rows and columns of the second memory completes the second step of the two step global interleaving process. An example of this second step is shown in FIG. 3 discussed above. A data decode algorithm is applied to a globally interleaved codeword read as an entire row of the second memory (block 480). In some cases, the data decode algorithm is a low density parity check algorithm as are known in the art. It should be noted that while flow diagram 400 is described in relation to two global chunks, that it may be expanded to include three or more global chunks stored to selected rows with available columns that correspond to the column where the given global chunk is stored in the central memory.

It is determined whether the decode algorithm converged (i.e., the original data set is identified) (block 485). Where the data decode algorithm converged (block 485), the decoded output is provided as a data output (block 499). Otherwise, where the data decode algorithm failed to converge (block 485) the decoded output is partially de-interleaved (block 490). This partial de-interleaving includes reversing the processes discussed above in relation to FIG. 3. The resulting partially de-interleaved data set is stored to the central memory (block 495).

Figure 5:
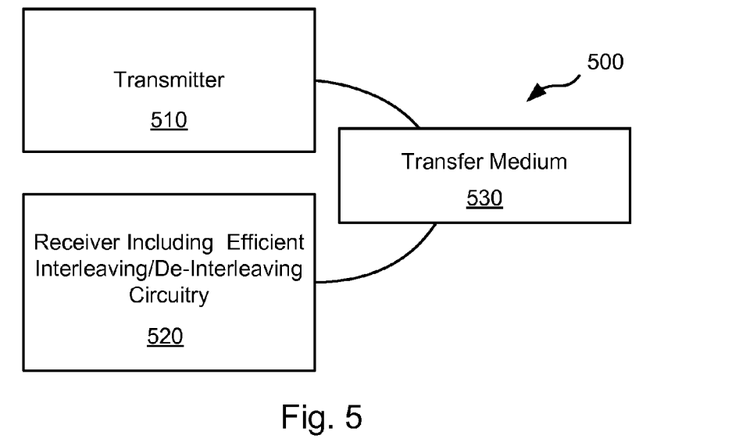
FIG. 5 shows a data transmission system including a receiver having efficient interleaving circuitry in accordance with some embodiments of the present invention.

Turning to FIG. 5, a data transmission system 500 including a receiver 520 having efficient interleaving circuitry is shown in accordance with some embodiments of the present invention. Data transmission system 500 includes a transmitter 510 that is operable to transmit encoded information via a transfer medium 530 as is known in the art. The encoded data is received from transfer medium 530 by receiver 520. Receiver 520 incorporates multi-pattern noise predictive filter adaptation circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via an efficient interleaving/de-interleaving circuit. The efficient interleaving/de-interleaving circuit may be implemented similar to that discussed above in relation to FIG. 1, and/or may operate similar to that discussed in above in relation to FIG. 4.

Figure 6:
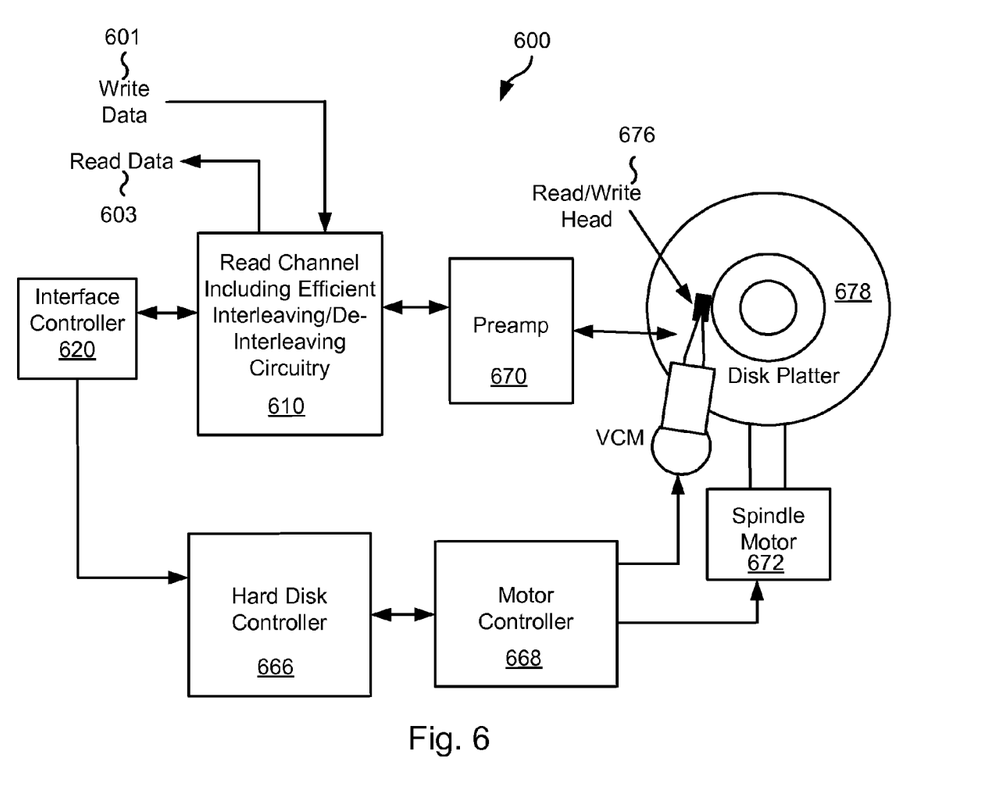
FIG. 6 shows a storage device including a read channel having efficient interleaving circuitry in accordance with one or more embodiments of the present invention.

Turning to FIG. 6, a storage system 600 including a read channel circuit 610 including efficient interleaving circuitry in accordance with one or more embodiments of the present invention. Storage system 600 may be, for example, a hard disk drive. Storage system 600 also includes a preamplifier 670, an interface controller 620, a hard disk controller 666, a motor controller 668, a spindle motor 672, a disk platter 678, and a read/write head assembly 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with either a longitudinal or a perpendicular recording scheme.

In a typical read operation, read/write head assembly 676 is accurately positioned by motor controller 668 over a desired data track on disk platter 678. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel circuit 610 via preamplifier 670. Preamplifier 670 is operable to amplify the minute analog signals accessed from disk platter 678. In turn, read channel circuit 610 decodes and digitizes the received analog signal to recreate the information originally written to disk platter 678. This data is provided as read data 603 to a receiving circuit. A write operation is substantially the opposite of the preceding read operation with write data 601 being provided to read channel circuit 610. This data is then encoded and written to disk platter 678.

During a read operation, data received from preamplifier circuit 670 is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via an efficient interleaving/de-interleaving circuit. The efficient interleaving/de-interleaving circuit may be implemented similar to that discussed above in relation to FIG. 1, and/or may operate similar to that discussed in above in relation to FIG. 4.

It should be noted that storage system 600 may be integrated into a larger storage system such as, for example, a RAID (redundant array of inexpensive disks or redundant array of independent disks) based storage system. It should also be noted that various functions or blocks of storage system 600 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a local interleaver circuit operable to: receive a data input that includes at least a first local chunk and a second local chunk, rearrange an order of the first local chunk and the second local chunk to yield a locally interleaved data set, and write the locally interleaved data set to a first row of a first memory;
   wherein the locally interleaved data set includes at least a first global chunk stored to a first column of the first memory, and a second global chunk stored to a second column of the first memory; and
   a column controlled interleaver circuit operable to: access the locally interleaved data set from the first row of the first memory, store the first global chunk to the first column and a second row of a second memory, store the second global chunk to the second column and a third row of the second memory.

2. The data processing circuit of claim 1, wherein the data processing system is implemented as part of a device selected from a group consisting of: a storage device and a receiving device.

3. The data processing system of claim 1, wherein the data processing system is implemented as part of an integrated circuit.

4. The data processing system of claim 1, wherein the first row of the first memory is randomly selected.

5. The data processing system of claim 1, wherein the second row of the second memory is randomly selected, and wherein the third row of the second memory is randomly selected.

6. The data processing system of claim 1, wherein the first column of the second memory is selected to correspond to the first column of the first memory, and wherein the second column of the second memory is selected to correspond to the second column of the first memory.

7. The data processing system of claim 1, wherein the system further comprises:
   a data detector circuit operable to apply a data detection algorithm to a data set to yield the data input; and
   a data decoder circuit operable to apply a data decode algorithm to a globally interleaved data set generated by accessing the second row of the second memory including the first global chunk.

8. The data processing circuit of claim 7, wherein the data detection algorithm is selected from a group consisting of: a maximum a posteriori data detection algorithm, and a Viterbi algorithm data detection algorithm.

9. The data processing circuit of claim 7, wherein the data decode algorithm is a low density parity check algorithm.

10. A storage device, the storage device comprising:
    a storage medium;
    a head assembly disposed in relation to the storage medium and operable to provide a sensed signal corresponding to information on the storage medium;
    a read channel circuit including:
    an analog to digital converter circuit operable to sample an analog signal derived from the sensed signal to yield a series of digital samples;
    an equalizer circuit operable to equalize the digital samples to yield an equalized output;
    a data detector circuit operable to apply a data detection algorithm to the equalized output to yield a detected output;
    a local interleaver circuit operable to: receive a data input that includes at least a first local chunk and a second local chunk, rearrange an order of the first local chunk and the second local chunk to yield a locally interleaved data set, and write the locally interleaved data set to a first row of a first memory;
    wherein the locally interleaved data set includes at least a first global chunk stored to a first column of the first memory, and a second global chunk stored to a second column of the first memory;
    a column controlled interleaver circuit operable to: access the locally interleaved data set from the first row of the first memory, store the first global chunk to the first column and a second row of a second memory, store the second global chunk to the second column and a third row of the second memory;
    wherein the first column of the second memory corresponds to the first column of the first memory, and wherein the second column of the second memory corresponds to the second column of the first memory; and
    a data decoder circuit operable to apply a data decode algorithm to a globally interleaved data set generated by accessing the second row of the second memory including the first global chunk.

* * * * *